(12) United States Patent
Matsuura et al.

(10) Patent No.: US 7,202,565 B2
(45) Date of Patent: Apr. 10, 2007

(54) SEMICONDUCTOR DEVICE WHICH EMPLOYS AN INTERLAYER INSULATING FILM OF A LOW MECHANICAL STRENGTH AND A HIGHLY RELIABLE METAL PAD, AND A METHOD OF MANUFACTURING THE SAME

(75) Inventors: Masazumi Matsuura, Hyogo (JP); Hiroshi Horibe, Hyogo (JP); Susumu Matsumoto, Osaka (JP); Tsuyoshi Hamatani, Shiga (JP)

(73) Assignees: Renesas Technology Corp., Tokyo (JP); Matsushita Electric Industrial Co., Ltd., Osaka (JP)

( * ) Notice: Subject to any disclaimer, the term of this patent is extended or adjusted under 35 U.S.C. 154(b) by 216 days.

(21) Appl. No.: 10/933,423

(22) Filed: Sep. 3, 2004

(65) Prior Publication Data
US 2005/0054188 A1 Mar. 10, 2005

(30) Foreign Application Priority Data
Sep. 8, 2003 (JP) ............................. 2003-315496

(51) Int. Cl.
  *H01L 23/48* (2006.01)
  *H01L 23/52* (2006.01)
  *H01L 29/40* (2006.01)
(52) U.S. Cl. .................. 257/758; 257/759; 257/760; 438/612
(58) Field of Classification Search ............... 257/758, 257/759, 760; 438/612
See application file for complete search history.

(56) References Cited
U.S. PATENT DOCUMENTS 5,149,674 A  9/1992 Freeman, Jr. et al.
5,736,791 A  4/1998 Fujiki et al.

(Continued)

FOREIGN PATENT DOCUMENTS

CN  1311530  9/2001

(Continued)

OTHER PUBLICATIONS

Inohara, M. et al. "HIgh Performance Copper and Low-k Interconnect Technology Fully Compatible to 90 nm-node SOC application (CMOS4)", Technical Digest of 2002 IEDM, pp. 77-80.

*Primary Examiner*—Fernando L. Toledo
(74) *Attorney, Agent, or Firm*—McDermott Will & Emery LLP

(57) ABSTRACT

A semiconductor device includes: multiple kinds of interlayer insulating films formed on a semiconductor substrate and having different elastic moduli, respectively; a metal pad arranged on said multiple kinds of interlayer insulating films; the interlayer insulating film of a low elastic modulus having the lowest elastic modulus and having an opening located under the metal pad, the interlayer insulating film of a not-low elastic modulus having the elastic modulus larger than the elastic modulus of the interlayer insulating film of the low elastic modulus, being layered in contact with the interlayer insulating film of the low elastic modulus, and continuously extending over the opening and a region surrounding the opening and a metal interconnection layer arranged under the metal pad, filling the opening in the interlayer insulating film of the low elastic modulus, and being in contact with the interlayer insulating film of the not-low elastic modulus.

10 Claims, 5 Drawing Sheets

U.S. PATENT DOCUMENTS

| | | | |
|---|---|---|---|
| 5,739,587 A | 4/1998 | Sato | |
| 6,486,557 B1 * | 11/2002 | Davis et al. | 257/758 |
| 6,492,200 B1 * | 12/2002 | Park et al. | 438/113 |
| 2004/0058520 A1 * | 3/2004 | Burrell et al. | 438/612 |
| 2005/0253271 A1 * | 11/2005 | Nakata et al. | 257/758 |

FOREIGN PATENT DOCUMENTS

| | | |
|---|---|---|
| CN | 1399334 | 2/2003 |
| JP | 5-343466 | 12/1993 |
| JP | 11-340319 | 12/1999 |
| JP | 2000-183104 | 6/2000 |
| JP | 2000-340569 | 12/2000 |
| JP | 2001-267323 | 9/2001 |
| JP | 2001-308100 | 11/2001 |

* cited by examiner

SEMICONDUCTOR DEVICE WHICH EMPLOYS AN INTERLAYER INSULATING FILM OF A LOW MECHANICAL STRENGTH AND A HIGHLY RELIABLE METAL PAD, AND A METHOD OF MANUFACTURING THE SAME

BACKGROUND OF THE INVENTION

1. Field of the Invention

The present invention relates to a semiconductor device and a method of manufacturing the same, and particularly relates to a semiconductor device, which employs an interlayer insulating film of a low mechanical strength and a low dielectric constant, and has a highly reliable metal pad, as well as a method of manufacturing the same.

2. Description of the Background Art

In system LSIs in and after 0.18-micron generation, it is important to reduce signal delays in devices for achieving fast operations. The signal delay in the device is represented by a sum of a signal delay in a transistor and an interconnection delay, and the influence by the interconnection delay has been increasing with rapid reduction in interconnection pitch, as compared with the signal delay in the transistor. Since the interconnection delay is proportional to a product (R×C) of a resistance (R) and an interlayer capacitance (C), lowering of the interconnection resistance or reduction of the capacitance of the interlayer insulating film can effectively reduce the interconnection delay. For overcoming a problem of the signal delay, an embedded interconnection structure, in which an interlayer insulating film of a low dielectric constant and a copper interconnection are combined, has been actively studied.

A metal pad and its surrounding portion generally have a layer structure, in which a pad of aluminum or alloy of aluminum and copper is arranged at an uppermost layer for wire bonding, and is supported by a pad of a copper interconnection and a bear-plug both arranged under the pad of the aluminum or the alloy of aluminum and copper. This special structure of the metal pad and the portion surrounding it is disclosed in "High Performance Copper and Low-k Interconnect Technology Fully Compatible to 90 nm-node SOC application (CMOS4)", M. Inohara et al., Technical Digest of 2002 IEDM, pp. 77–80.

As described above, it has been actively studied to employ the interlayer insulating film of a low dielectric constant into a leading-edge system LSI for lowering the interconnection delay. As such a material of a low dielectric constant, it is possible to employ materials, which are formed of a spin coating method, such as hydrogen silsesquiooxane, methyl silsesquioxane, poly-arylether, polyphenylene polymer, benzocyclobutene, polytetrafluoroethylene and porous silica (e.g., xerogel or aerogel) as well as materials, which are formed of a CVD (Chemical Vapor Deposition) method, such as a fluorine-doped silicon oxide film (SiOF film), fluorine-doped amorphous carbon film (CF film), parylene and carbon-doped silicon oxide film (SiOC film).

The foregoing materials have a much smaller mechanical strength than conventional silicon oxide films. The following table 1 represents a result of comparison of a hardness and an elastic modulus between a silicon oxide film and a SiOC film used in a typical interlayer insulating film of a low dielectric constant.

TABLE 1

|  | Hardness | Elastic Modulus |
|---|---|---|
| SiO film (not low elastic modulus) | 9 (GPa) | 70–100 (GPa) |
| SiOC film (low elastic modulus) | 2 (GPa) | 13 (GPa) |

According to the table 1, the hardness and elastic modulus of the SiOC film having a low dielectric constant are much lower than those of the conventional silicon oxide film. In the following description, the lowering of the hardness and the lowering of the elastic modulus will be generally referred to as "lowering of a mechanical strength".

Due to the lowering of mechanical strength of the interlayer insulating film, a crack may occur in the interlayer insulating film arranged in the layer under the metal pad, or a junction failure may occur in wire-bond when probing is executed for wire bonding or device test. Therefore, many proposals have been made for increasing reliability of the metal pad and its surrounding portion, e.g., in Japanese Patent Laying-Open Nos. 2000-340569, 2000-183104 and 2001-308100.

SUMMARY OF THE INVENTION

However, an impact stress applied during wire boding increases with reduction in size of the metal pad. Therefore, it has been required to provide a lower structure of a metal pad, which can suppress a large strain, and thereby can prevent cracking and peeling of a film.

An object of the invention is to provide a semiconductor device and a method of manufacturing the same, which can prevent problems, i.e., cracking of an interlayer insulating film and a junction failure due to use of an interlayer insulating film of a low mechanical strength and a low dielectric constant.

A semiconductor device according to the invention includes multiple kinds of interlayer insulating films formed on a semiconductor substrate and having different elastic moduli, respectively, and a metal pad arranged on the multiple kinds of interlayer insulating films. The semiconductor device has the interlayer insulating film of a low elastic modulus having the lowest elastic modulus among the different elastic moduli and having an opening located under the metal pad, the interlayer insulating film of a not-low elastic modulus having the elastic modulus larger than the elastic modulus of the interlayer insulating film of the low elastic modulus, being layered in contact with the interlayer insulating film of the low elastic modulus and continuously extending over the opening and a region surrounding the opening, and a metal interconnection layer arranged under the metal pad, filling the opening in the interlayer insulating film of the low elastic modulus and being in contact with the interlayer insulating film of the not-low elastic modulus.

According to the above structure, the interlayer insulating film of the not-low elastic modulus and the metal interconnection layer are located under the metal pad, and the interlayer insulating film of the low elastic modulus is not located under the metal pad. Therefore, the interlayer insulating film of the low elastic modulus, in which a crack may occur in a wire bond, does not directly receive an impact stress caused by the wire bonding so that the crack can be prevented. It is also possible to suppress a strain, which may occur at an interface between the metal interconnection layer and the interlayer insulating film of the not-low elastic modulus, so that it is possible to prevent reliably the interlayer insulating film of the low elastic modulus from peeling at a position shifted from a position immediately under the metal pad.

The present invention also provides a method of manufacturing a semiconductor device having a metal pad for external electrical connection and formed on a semiconductor substrate. This manufacturing method includes the steps of forming an insulating layer of a low elastic modulus located above the semiconductor substrate, and having a smaller elastic modulus than a silicon oxide film; and providing an opening located at a portion of the insulating layer of the low elastic modulus to be used for formation of the metal pad. The method also includes the steps of forming a metal layer filling the opening and covering the insulating layer of the low elastic modulus; and effecting chemical mechanical polishing on the metal layer to expose the insulating layer of the low elastic modulus and the metal layer in the opening. The method further includes the steps of covering the metal layer subjected to the chemical mechanical polishing and the insulating layer of the low elastic modulus with an insulating layer having a larger elastic modulus than the insulating layer of the low elastic modulus; and providing the metal pad above a layer structure formed of the insulating layer of the low elastic modulus, the metal layer and the insulating layer of the not-low elastic modulus.

The above method can easily form a metal pad structure of high reliability.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings.

Figure 1:
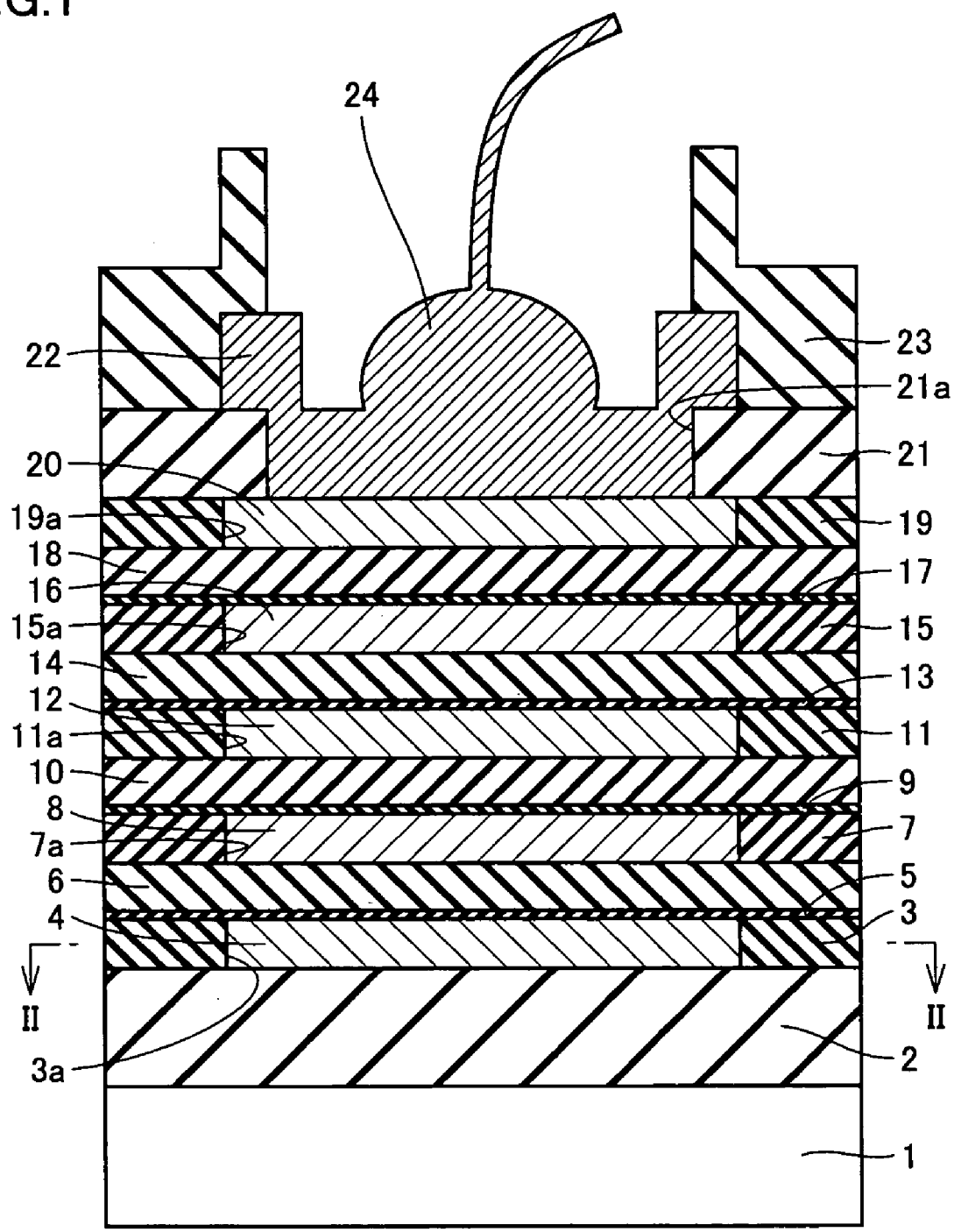
FIG. 1 shows a structure of a metal pad portion of a semiconductor device according to a first embodiment of the invention.

FIG. 1 shows a structure including a metal pad and a portion surrounding it according to a first embodiment of the invention. According to the first embodiment, an underlying insulating layer 2 including elements such as transistors is formed on a silicon substrate 1, and a first interlayer insulating film 3, which has a low dielectric constant selected for suppressing an interconnection capacitance, is formed on underlying insulating layer 2. The low dielectric constant may generally be lower than that of a silicon oxide film. Since the silicon oxide film has the dielectric constant of 4.3, first interlayer insulating film 3 substantially has the dielectric constant lower than 4.3. For reducing the interconnection capacitance, it is desirable that the dielectric constant takes a lower value. For example, it is desired that interlayer insulating film 3 is made of a material having a low dielectric constant not exceeding 3.

First interlayer insulating film 3 of the low dielectric constant has a low mechanical strength such as a low elastic modulus, and therefore may also be referred to as a "first interlayer insulating film of a low elastic modulus". This low elastic modulus may generally be lower than that of the silicon oxide film, and is specifically lower than 50 GPa in this embodiment. Therefore, the "interlayer insulating film of the not-low elastic modulus" already described represents an interlayer insulating film having an elastic modulus of 50 GPa or more. An "extremely large elastic modulus" represents an elastic modulus of 100 GPa or more. In many cases, the "interlayer insulating film of the not-low elastic modulus" in this description represents the interlayer insulating film having the extremely large elastic modulus unless otherwise specified. The elastic modulus can be obtained by a nano-indentation method.

Then, lithography and dry etching are effected on first interlayer insulating film 3 of the low dielectric constant to form an intended interconnection pattern groove (opening) 3a, and a first copper interconnection 4 is formed in opening 3a. Although not shown, first copper interconnection 4 is provided with barrier metal such as tantalum or tantalum nitride for the purpose of preventing diffusion of copper into the interlayer insulating film. This barrier metal covers the lower surface and the opposite side surfaces of first copper interconnection 4. Copper interconnections, which will be described below, are likewise covered with barrier metal unless otherwise specified.

According to this embodiment, first interlayer insulating film 3 of the low dielectric constant is formed of a carbon-doped silicon oxide film (SiOC film) formed by a plasma CVD method. The copper interconnection employed in this embodiment is formed in the following manner. First, a sputter method is executed to form a thin film of copper on the barrier metal of tantalum or tantalum nitride formed by a sputter method. Plating is then executed to form a thick film of copper on the thin film. Thus, the copper interconnection is formed of the thin film of copper formed by the sputter method and the thick film of copper formed by the plating.

Figure 2B:
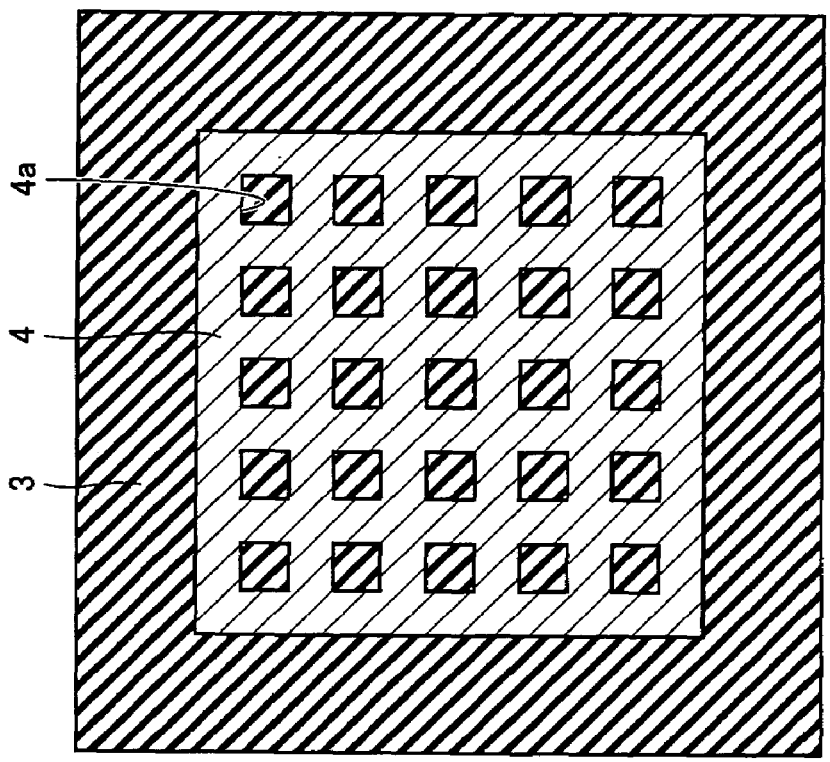
FIGS. 2A and 2B are cross sections taken along line II—II in FIG. 1, and show a metal interconnection layer without an aperture and a metal interconnection layer with apertures, respectively.
Figure 2A:
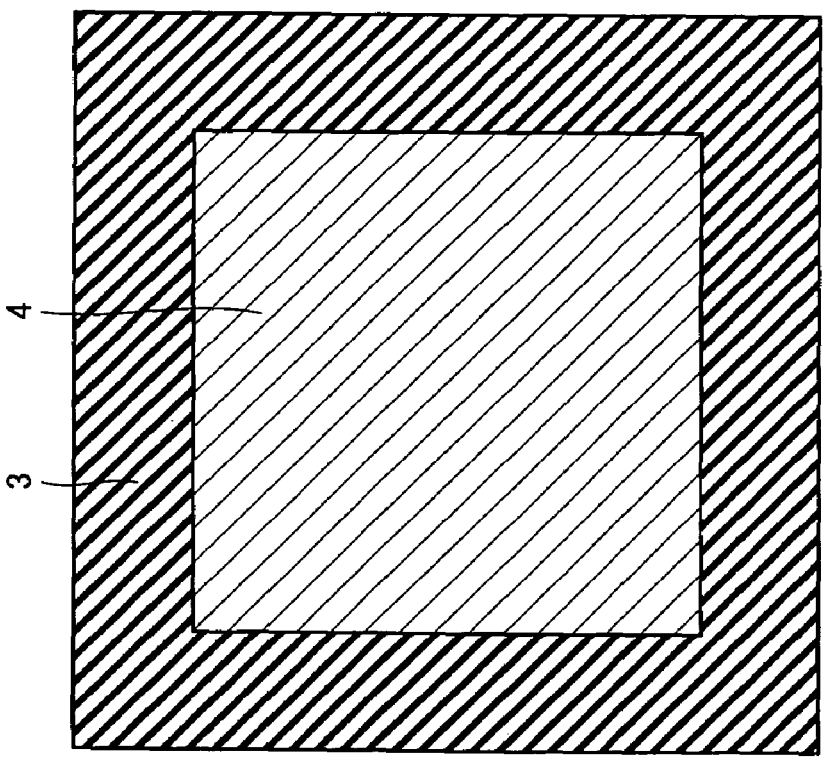

Thereafter, Chemical Mechanical Polishing (CMP) is effected to remove the copper and barrier metal from portions not requiring them so that first copper interconnection 4 is finally formed in groove (opening) 3a. Copper interconnection 4 may be an ordinary thin film having neither an aperture nor a space, or may be a thin film, which is internally provided with aligned apertures. Thus, on a section taken along line II—II in FIG. 1, first copper interconnection 4 may be a thin film having a solid structure as shown in FIG. 2A, or may be a thin film provided with apertures 4a aligned therein as shown in FIG. 2B. Apertures 4a are filled with insulating film 3 located in the same layer as copper interconnection 4. Thus, apertures 4a are filled with first interlayer insulating film 3 of the low dielectric constant.

Then, first and second interlayer insulating films 5 and 6 of the not-low dielectric constant each having a dielectric constant and an elastic modulus higher than those of first interlayer insulating film 3 of the low dielectric constant. In this description, a layer formed of first interlayer insulating film 3 of the low dielectric constant, first interlayer insulating film 5 of the not-low dielectric constant and second interlayer insulating film 6 of the not-low dielectric constant is generally referred to as a "first layer."

Then, a second interlayer insulating film 7 having a low dielectric constant is formed on the first layer. Then, lithography and dry etching are effected on second interlayer insulating film 7 of the low dielectric constant to form a groove (opening) 7a of an intended interconnection pattern. The CMP processing or the like is then executed to form a second copper interconnection 8 in opening 7a. Third and fourth interlayer insulating films 9 and 10 of the not-low dielectric constant are formed on second copper interconnection 8. Second interlayer insulating film 7 of the low dielectric constant as well as third and fourth interlayer insulating films 9 and 10 of the not-low dielectric constant form a second layer.

First and third interlayer insulating films 6 and 9 of the not-low dielectric constant in this embodiment may be formed of a silicon nitride film or a silicon carbide film deposited by the plasma CVD method, or may be formed of a nitrogen-doped silicon carbide film or an oxygen-doped silicon carbide film. This embodiment employs the silicon carbide films. Second and fourth interlayer insulating films 6 and 10 of the not-low dielectric constant are formed of silicon oxide films deposited by the plasma CVD method. As represented in the table 1, these silicon oxide films have a hardness and an elastic modulus higher than those of the SiOC film forming the interlayer insulating film of the low dielectric constant of the embodiment, and can effectively suppress cracks due to probing and wire bonding Then, interlayer insulating films and copper interconnections providing third and fourth layers are formed in a manner similar to that for the second layer. Finally, interlayer insulating film 19 of the low dielectric constant and a copper interconnection 20 in a fifth layer are formed.

A first passivation film 21 is formed on the copper interconnection in the fifth layer thus formed. Then, etching is effected on first passivation film 21 in accordance with a pattern of arrangement of a connection aperture 21a so that copper interconnection 20 in the fifth layer is exposed on the surface.

First passivation film 21 may be formed of a silicon nitride film, silicon oxide film or silicon oxynitride film prepared by the plasma CVD method. On first passivation film 21, an aluminum pad 22 is formed by the sputtering method, and a second passivation film 23 is formed to cover the surfaces thereof. Second passivation film 23 may likewise be formed of a silicon nitride film, silicon oxide film or silicon oxynitride film prepared by the plasma CVD method. Second passivation film 23 is etched in accordance with an intended pattern to provide wire bond so that aluminum pad 22 is exposed. Finally, a wire bond portion 24 is formed on aluminum pad 22.

In a structure of a conventional metal pad, an interlayer insulating film of a low elastic modulus having a low elastic modulus is arranged under the metal pad. When the aluminum pad having the above structure is strained vertically downward, a large amount of strain occurs on an interface between portions having significantly different elastic moduli, respectively, and thus on an interface between a copper interconnection and an SiOC film, or between a silicon oxide film and an SiOC film. Consequently, an internal stress accumulated on such an interface locally increases. This increase in internal stress promotes peeling on the interface, and consequently causes cracks in the film and a junction failure (peeling) in the wire bond portion.

According to the structure of the semiconductor device of the embodiment, the silicon oxide film having a large elastic modulus and the interconnection of copper, which generally has an elastic modulus of about 130 GPa similarly to the silicon oxide film, are arranged immediately under the aluminum pad, and the interlayer insulating film of the low elastic modulus is not arranged immediately under the aluminum pad. Consequently, a difference in elastic modulus can be reduced by the structure of the embodiment, in which the silicon oxide film and the copper interconnection having the high elastic moduli are arranged immediately under the aluminum pad. Accordingly, it is possible to reduce an amount of vertical strain, which may occur immediately under the aluminum pad at the times of the wire bonding and test probing, and therefore it is possible to prevent a crack due to the wire bonding or test probing as well as a junction failure in the wire bond.

According to the above embodiment, the copper interconnections are inserted into all the five interconnection layers, respectively. However, the copper interconnection(s) may be inserted into one or some of the interconnection layers, in which case the substantially same effect can be achieved. In the latter case, it is desired to insert the copper interconnection(s) into the interconnection layer(s) near the aluminum pad.

In this embodiment, the silicon oxide film having the high elastic modulus is arranged as layer 21 having connection aperture 21a. In this structure, the silicon oxide film arranged in the layer having the connection aperture is present also in portions other than the aluminum pad such as a portion, in which a metal interconnection (copper interconnection) is arranged for connecting elements together. Even in this structure, since the interlayer insulating film of the low dielectric constant is arranged between the metal interconnections, arrangement of the silicon oxide film causes only slight increase in capacitance between the interconnections. For the purpose of minimizing the capacitance between interconnections, an interlayer insulating film of a low dielectric constant may be arranged at metal interconnection portions other than the aluminum pad in the layer having the connection aperture. In this case, a silicon oxide film may be selectively arranged at a portion, which is located immediately under the aluminum pad, and a portion surrounding it in the layer having the connection aperture.

(Second Embodiment)

Figure 3:
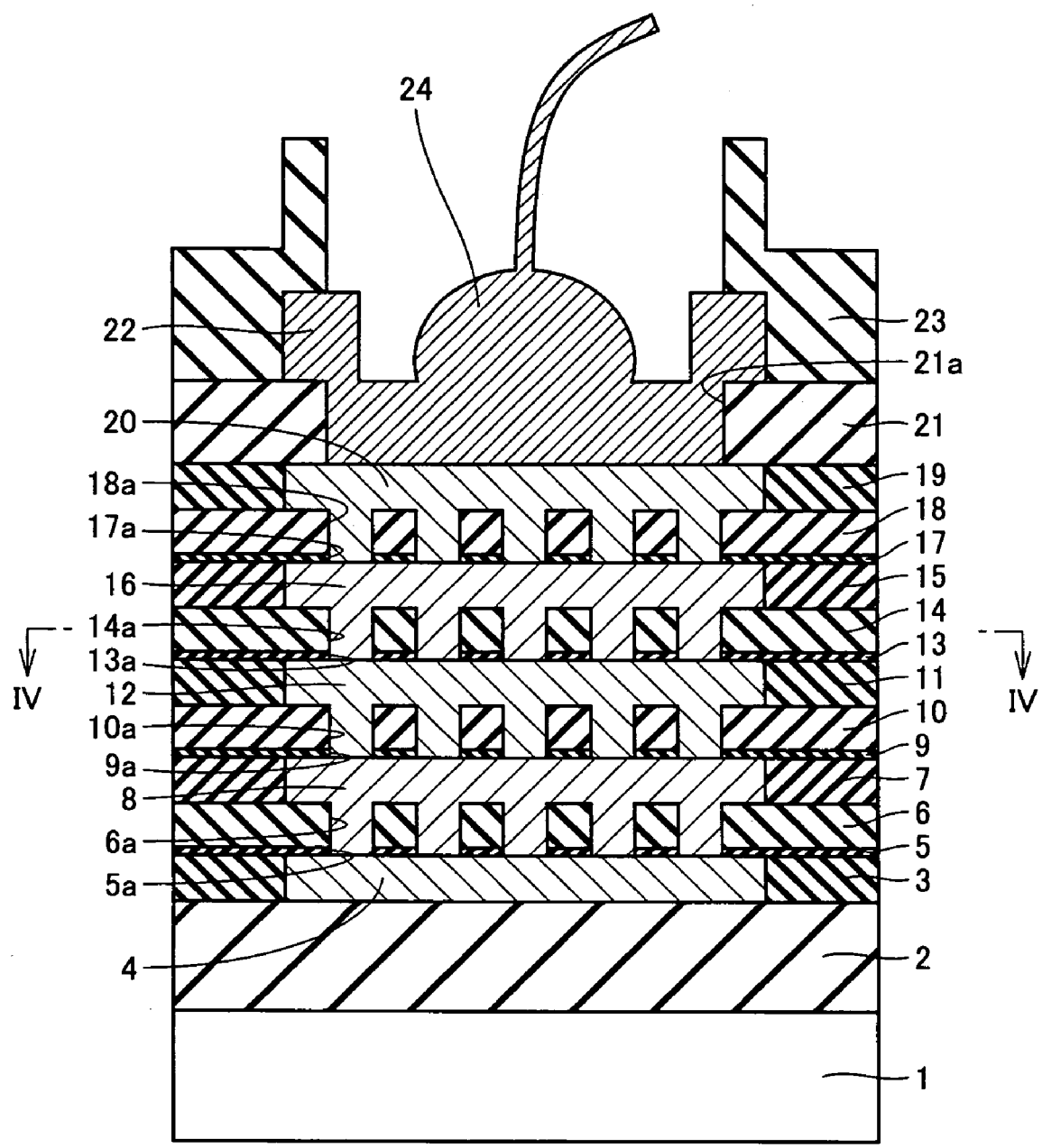
FIG. 3 shows a structure of a metal pad portion of a semiconductor device according to a second embodiment of the invention.

FIG. 3 shows a structure of a metal pad of a semiconductor device according to a second embodiment of the invention. A method of forming the interlayer insulating films and the copper interconnections is completely the same as that in the first embodiment, and therefore description thereof is not repeated.

The second embodiment of the invention differs from the first embodiment in that the copper interconnection in each layer fills the connection aperture under it. More specifically, second copper interconnection 8 in the second layer fills connection apertures 5a and 6a. In the third layer, a third copper interconnection 12 fills connection apertures 9a and 10a. Likewise, a fourth layer includes a fourth copper interconnection 16 filling connection apertures 13a and 14a, and a fifth layer includes fifth copper interconnection 20 filling connection apertures 17a and 18a. The connection apertures described above may be merely referred to as "apertures", respectively.

Figure 4B:
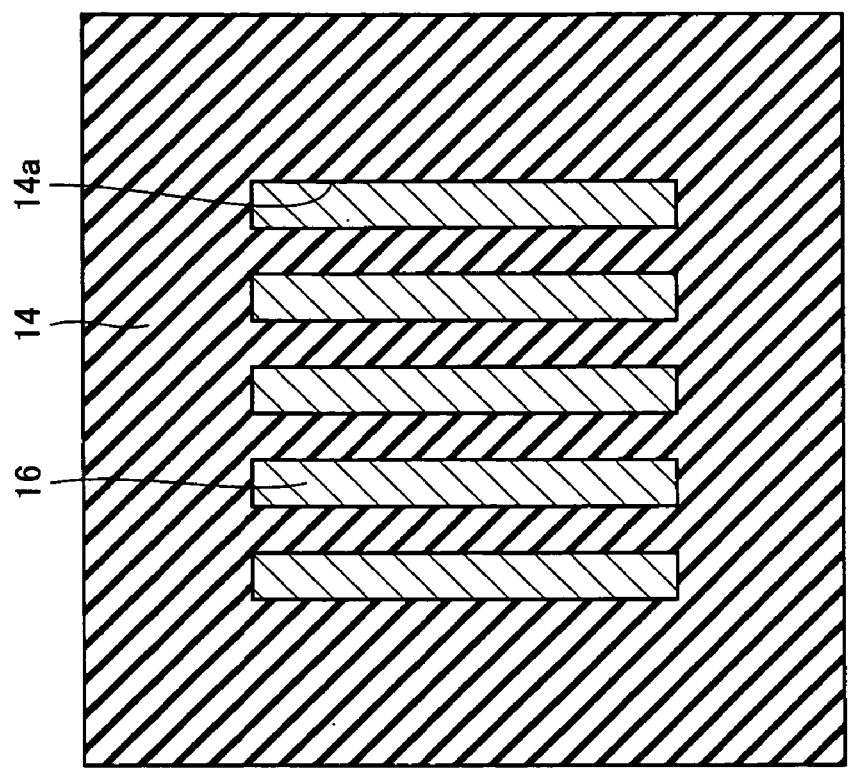
FIGS. 4A and 4B are cross sections taken along line IV—IV in FIG. 3, and show a structure having discrete apertures filled with a metal interconnection layer and a structure having stripe-shaped apertures filled with a metal interconnection layer, respectively.
Figure 4A:
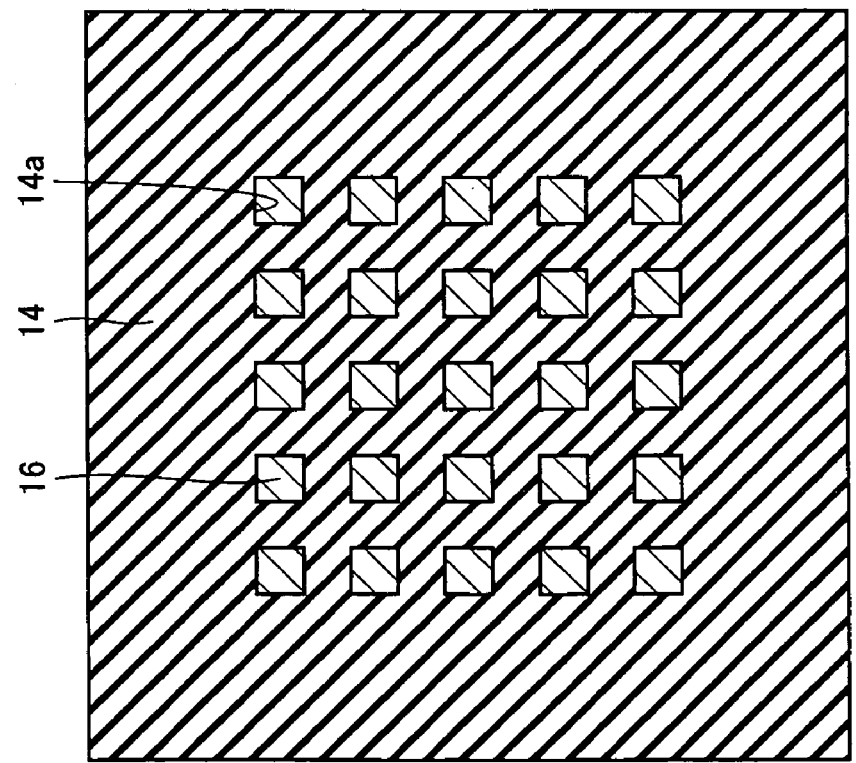

A section taken along line IV—IV in FIG. 3 may have a structure represented by FIG. 4A or 4B. The copper interconnection may fill discrete apertures 14a as shown in FIG. 14A, or may fill stripe-shaped apertures 14a as shown in FIG. 4B. In either of these cases, the connection apertures are represented by the "apertures".

In this embodiment, since a portion of the copper filling the connection aperture is added to the structure, the mechanical strength of the portion immediately under the aluminum pad can be larger than that in the first embodiment. This can reduce further effectively the strain due to the wire bonding or test probing. Consequently, it is possible to prevent a crack due to the wire bonding or test probing as well as a junction failure in the wire bond.

(Third Embodiment)

Figure 5:
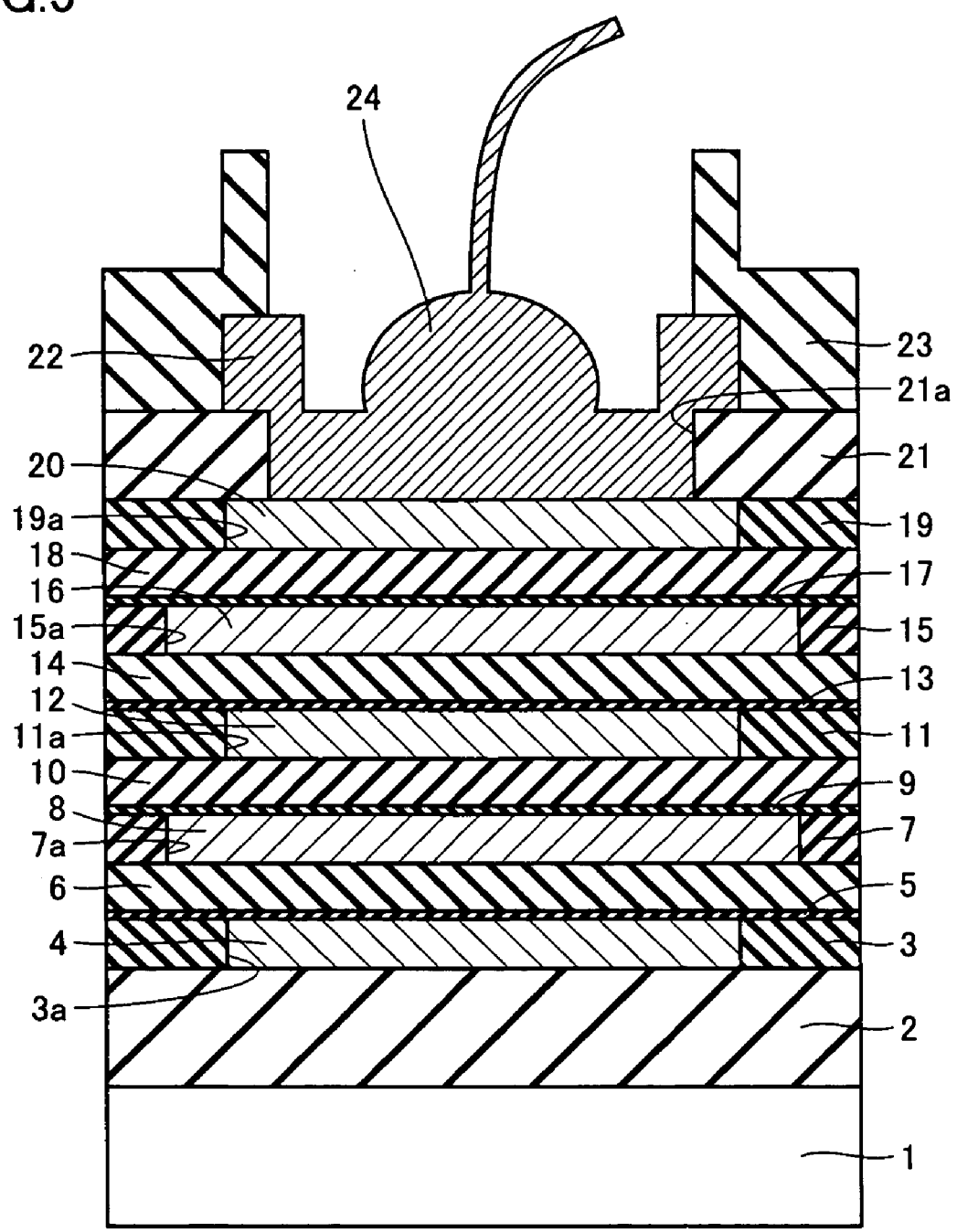
FIG. 5 shows a structure of a metal pad portion of a semiconductor device according to a third embodiment of the invention.

FIG. 5 shows a structure of a metal pad of a semiconductor device according to a third embodiment of the invention. A method of forming the interlayer insulating films and the copper interconnections in this embodiment is completely the same as that in the first embodiment, and therefore description thereof is not repeated. The third embodiment differs from the first embodiment in that copper interconnections 4, 8, 12, 16 and 20 arranged in openings 3a, 7a, 11a, 15a and 19a, which are provided at the interlayer insulating films of low elastic moduli in the respective layers, do not have uniform planar sizes. More specifically, the copper interconnection in each layer has a planar size different from that of the copper interconnection(s) in a vertically neighboring layer(s). Copper interconnection 8 in the second layer has a larger planar size than copper interconnection 4 in the first layer. The copper interconnections in the third and fifth layers have a small planar size similarly to that in the first layer, and the copper interconnection in the fourth layer has a large planar size similarly to that in the second layer.

According to the third embodiment, since copper interconnections 4, 8, 12, 16 and 20 have alternately varying sizes, it is possible to suppress concentration of a strain around the copper interconnections. If the inserted copper interconnections have uniform planar sizes, edges of the copper interconnections are vertically aligned to each other. This increases the strain concentrated around the copper interconnections, which are in contact with the interlayer insulating films of the low dielectric constant. The staggered edges of the copper interconnections in this embodiment can suppress concentration of the strain.

The structure, in which the copper interconnections have the sizes varying in an alternating fashion, may be provided with the copper interconnections filling the connection apertures similarly to the second embodiment. This can achieve an effect similar to that of the second embodiment in addition to the foregoing effect of this embodiment.

Finally, various embodiments of the invention including the embodiments already described are set forth below.

The interlayer insulating film of the not-low elastic modulus may be formed of a first interlayer insulating film of a not-low elastic modulus and a second interlayer insulating film of a not-low elastic modulus, which is located above and in contact with the first interlayer insulating film, and is made of a material different from that of the first interlayer insulating film.

Two interlayer insulating films each having a not-low elastic modulus may be layered so that an impact energy can be damped at an interface between these two interlayer insulating films having a high strength, and a crack caused by another stress-concentrated portion can be prevented.

As already described repetitively, the invention is predicated on that the interlayer insulating film of the not-low elastic modulus has a larger dielectric constant than the interlayer insulating film of the low elastic modulus.

The interlayer insulating film of the not-low elastic modulus located in the opening under the metal pad may be provided with an aperture, which is filled by a metal interconnection layer. A metal interconnection of copper or the like has an extremely high elastic modulus of about 100 GPa or more. The structure, in which the metal interconnection filling the apertures extends vertically continuously, can achieve a high mechanical strength. It can be expected that the above structure can damp an impact energy at the interfaces between side surfaces of the apertures of the interlayer insulating films and the metal interconnection.

The above metal interconnection layer may be provided with an aperture, which is filled with an interlayer insulating film of a low elastic modulus located in the same layer as this metal interconnection layer. In this structure, a large difference in elastic modulus does not occur at the interface between the layers so that the mechanical strength can be improved. It can be expected to damp an impact energy at the interface between a side surface of the aperture of the metal interconnection and the interlayer insulating film.

Two or more layer structures, each of which includes an interlayer insulating film of a not-low elastic modulus and an interlayer insulating film of a low elastic modulus having an opening filled with the metal interconnection layer, may be layered in the opening already described. This multi-layer structure can achieve matching with many other portions forming a structure, which achieve original functions of the semiconductor device. Further, each interface in the multi-layer structure can be effective at absorbing the impact energy, e.g., at the wire bond.

In the above multi-layer structure, which is provided with the two or more layer structures arranged in the opening and each including the interlayer insulating film of the not-low elastic modulus and the interlayer insulating film of the low elastic modulus having the opening filled with the metal interconnection layer, the metal interconnection layers in the vertically neighboring layers may have different planar sizes, respectively. This structure can prevent vertical alignment of the edges of the metal interconnections, and thus can suppress concentration of the stress, which may be caused by metal interconnections having aligned edges.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   multiple kinds of interlayer insulating films formed on a semiconductor substrate and having different elastic moduli, respectively;
   a metal pad for wire bonding arranged on said multiple kinds of interlayer insulating films;
   the multiple kinds of interlayer insulating films including a first interlayer insulating film having the lowest elastic modulus among said different elastic moduli and having an opening located under said metal pad;
   the multiple kinds of interlayer insulating films including a second interlayer insulating film having an elastic modulus larger than the lowest elastic modulus, being underlying and in contact with said first interlayer insulating film; and a metal interconnection layer having an elastic modulus larger than the lowest elastic modulus, arranged under said metal pad, filling the opening in said first interlayer insulating film, and being in contact with said second interlayer insulating film at a lower surface of the metal interconnection layer, wherein the metal interconnection layer and the second interlayer insulating film are arranged immediately under the metal pad, and the first interlayer insulating film is not arranged under the metal pad by arranging the metal pad in an area of the opening.

2. The semiconductor device according to claim 1, wherein
said second interlayer insulating film is formed of a third interlayer insulating film of a not-low elastic modulus and a fourth interlayer insulating film of a not-low elastic modulus different in material from said first interlayer insulating film of the not-low elastic modulus.

3. The semiconductor device according to claim 2, wherein said second interlayer insulating film located under said metal pad is provided with an aperture, and the metal interconnection layer fills said aperture.

4. The semiconductor device according to claim 2, further comprising:
two or more layer structures each including an interlayer insulating film of a not-low elastic modulus, and the interlayer insulating films of a low elastic modulus each having an opening filled with a metal interconnection layer.

5. The semiconductor device according to claim 2, further comprising:
two or more layer structures each including an interlayer insulating film of a not-low elastic modulus, and the interlayer insulating films of the low elastic modulus each having an opening filled with a metal interconnection layer, wherein
the layer structures vertically neighboring to each other have said metal interconnection layers having different planar sizes, respectively.

6. The semiconductor device according to claim 2, wherein
said metal interconnection layer has an aperture, and an interlayer insulating film of the lowest elastic modulus located in the same layer structure as said metal interconnection layer having said aperture fills said aperture.

7. The semiconductor device according to claim 6, further comprising:
two or more layer structures each including an interlayer insulating film of a not-low elastic modulus, and the interlayer insulating films of the low elastic modulus each having an opening filled with a metal interconnection layer, wherein
the layer structures vertically neighboring to each other have said metal interconnection layers having different planar sizes, respectively.

8. The semiconductor device according to claim 1, wherein
said second interlayer insulating film has a larger dielectric constant than said first interlayer insulating film.

9. The semiconductor device according to claim 8, wherein
two or more layer structures each including an interlayer insulating film of a not-low elastic modulus, and an interlayer insulating film of the lowest elastic modulus having an opening filled with a metal interconnection layer, wherein
the layer structures vertically neighboring to each other have said metal interconnection layers having different planar sizes, respectively.

10. A method of manufacturing a semiconductor device having a metal pad for external electrical connection and formed on a semiconductor substrate, comprising the steps of:
forming a first insulating layer located above said semiconductor substrate;
forming a second insulating layer located on said first insulating layer, and having a smaller elastic modulus than the first insulating layer and a silicon oxide film;
providing an opening in said second insulating layer exposing the first insulating layer at the bottom, and extending a whole area for formation of said metal pad in plan view;
forming a metal layer filling said opening and covering said second insulating layer, and contacting the first insulating layer at the bottom of the opening;
effecting chemical mechanical polishing on said metal layer to expose said insulating layer of the low elastic modulus and said metal layer in said opening; and
providing the metal pad above a layer structure formed of said insulating layer of the low elastic modulus, the metal layer and the insulating layer of the not-low elastic modulus.

* * * * *